United States Patent
Aoyagi et al.

(10) Patent No.: US 10,811,562 B2
(45) Date of Patent: Oct. 20, 2020

(54) LIGHT EMITTING DIODE (71) Applicant: SONY CORPORATION, Tokyo (JP)

(72) Inventors: Hidekazu Aoyagi, Miyagi (JP); Takahiro Arakida, Miyagi (JP); Takahiko Kawasaki, Miyagi (JP); Katsutoshi Itou, Miyagi (JP); Makoto Nakashima, Miyagi (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/544,101

(22) PCT Filed: Oct. 22, 2015

(86) PCT No.: PCT/JP2015/079841
§ 371 (c)(1),
(2) Date: Jul. 17, 2017

(87) PCT Pub. No.: WO2016/125344
PCT Pub. Date: Aug. 11, 2016

(65) Prior Publication Data
US 2017/0358711 A1  Dec. 14, 2017

(30) Foreign Application Priority Data

Feb. 3, 2015 (JP) .................. 2015-019390

(51) Int. Cl.
*H01L 33/42* (2010.01)
*H01L 33/24* (2010.01)
(Continued)

(52) U.S. Cl.
CPC .............. *H01L 33/24* (2013.01); *H01L 33/14* (2013.01); *H01L 33/20* (2013.01); *H01L 33/30* (2013.01); *H01L 33/42* (2013.01); *H01L 33/44* (2013.01)

(58) Field of Classification Search
CPC .......................................... H01L 33/0004–648
See application file for complete search history.

(56) References Cited

U.S. PATENT DOCUMENTS

| 6,324,199 B1 * | 11/2001 | Capasso | ................. B82Y 20/00 |
| | | | 372/45.01 |
| 2003/0127658 A1 * | 7/2003 | Sheu | ..................... B82Y 20/00 |
| | | | 257/79 |

(Continued)

FOREIGN PATENT DOCUMENTS

| JP | 58-040872 A | 3/1983 |
| JP | 08-213649 A | 8/1996 |

(Continued)

OTHER PUBLICATIONS

International Search Report and Written Opinion of PCT Application No. PCT/JP2015/079841, dated Dec. 8, 2015, 02 pages of English Translation and 08 pages of ISRWO.

*Primary Examiner* — Cuong B Nguyen
(74) *Attorney, Agent, or Firm* — Chip Law Group (57) ABSTRACT

A light emitting diode including: a columnar laminated structure 20 in which a first compound semiconductor layer 21, a light emitting layer 23, and a first portion 22A of a second compound semiconductor layer are laminated; a first electrode 31 electrically connected to the first compound semiconductor layer 21; and a second electrode 32. A second portion 22B of the second compound semiconductor layer is formed on the first portion 22A of the second compound semiconductor layer, apart from an edge portion $22a_3$ of the first portion 22A of the second compound semiconductor layer, the second electrode 32 is formed at least on a top surface of the second portion 22B of the second compound semiconductor layer, and light is outputted at least from the (Continued)

top surface $22b_1$ and a side surface $22b_2$ of the second portion 22B of the second compound semiconductor layer.

9 Claims, 6 Drawing Sheets

(51) Int. Cl.
*H01L 33/30* (2010.01)
*H01L 33/14* (2010.01)
*H01L 33/20* (2010.01)
*H01L 33/44* (2010.01)

(56) References Cited

U.S. PATENT DOCUMENTS

| | | | |
|---|---|---|---|
| 2005/0087758 A1* | 4/2005 | Kwak | H01L 21/28575 257/99 |
| 2006/0097278 A1* | 5/2006 | Goto | H01S 5/0207 257/103 |
| 2010/0032694 A1* | 2/2010 | Kim | H01L 33/42 257/88 |
| 2010/0065868 A1 | 3/2010 | Kitagawa et al. | |
| 2010/0221856 A1* | 9/2010 | Fujimoto | H01L 33/005 438/29 |
| 2011/0024781 A1* | 2/2011 | Fujimoto | H01L 33/20 257/98 |
| 2012/0326118 A1 | 12/2012 | Nitta | |

FOREIGN PATENT DOCUMENTS

| | | |
|---|---|---|
| JP | 8-213649 A | 8/1996 |
| JP | 2006-108259 A | 4/2006 |
| JP | 2007-165725 A | 6/2007 |
| JP | 2010-067928 A | 3/2010 |
| JP | 2010-171142 A | 8/2010 |
| JP | 2013-008817 A | 1/2013 |
| JP | 2013-110374 A | 6/2013 |

* cited by examiner

LIGHT EMITTING DIODE

CROSS REFERENCE TO RELATED APPLICATIONS

This application is a U.S. National Phase of International Patent Application No. PCT/JP2015/079841 filed on Oct. 22, 2015, which claims priority benefit of Japanese Patent Application No. JP 2015-019390 filed in the Japan Patent Office on Feb. 3, 2015. Each of the above-referenced applications is hereby incorporated herein by reference in its entirety.

TECHNICAL FIELD

The present disclosure relates to a light emitting diode (LED).

BACKGROUND ART

Figure 7:
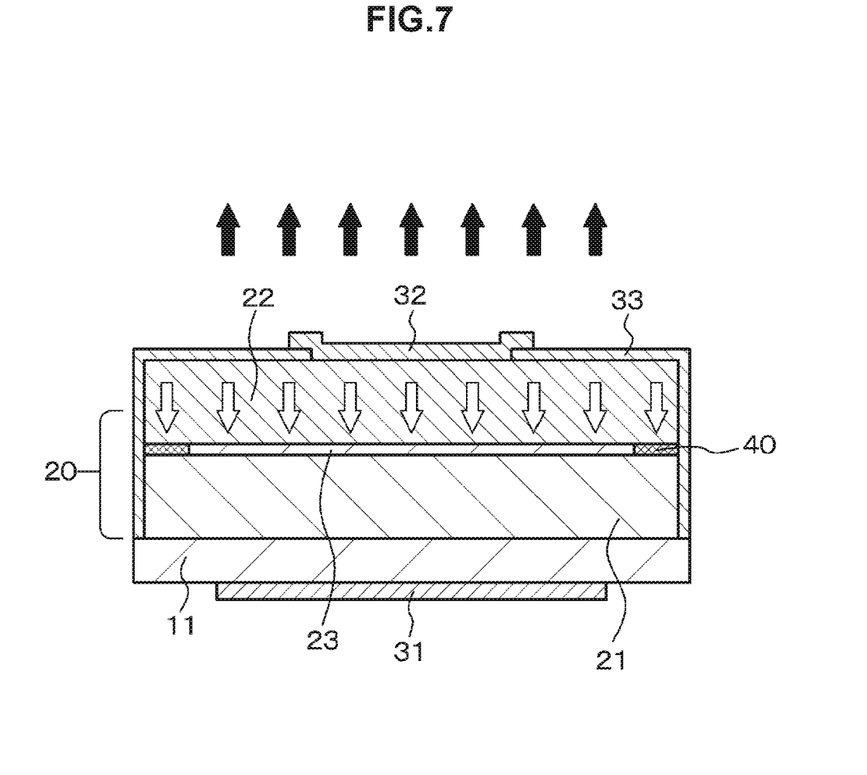
FIG. 7 is a schematic cross-sectional view of a past light-emitting diode for explaining a problem of the past light-emitting diode.

As shown in a schematic cross-sectional view in FIG. 7, a light emitting diode (LED) generically includes:

a columnar laminated structure 20 in which a first compound semiconductor layer 21, a light emitting layer 23 formed of a compound semiconductor, and a second compound semiconductor layer 22 are laminated;

a first electrode 31 electrically connected to the first compound semiconductor layer 21; and a second electrode 32 formed on the second compound semiconductor layer 22. Note that reference number 11 denotes a substrate, and reference number 33 denotes an insulating layer. Further, in recent years, miniaturization of a light emitting diode for application to a printer or a display has been earnestly examined. The area of the light emitting layer of the light emitting diode in such a field is, e.g., 250 $\mu m^2$ or less.

Incidentally, as the miniaturization of the light emitting diode progresses, non-emission recombination in a region 40 near an edge portion of the light emitting layer 23 in the columnar laminated structure 20a gives larger influence on light-emitting efficiency. Herein, the non-emission recombination is a phenomenon in which positive holes and electrons are combined and carries generate heat without emitting light, and easily occurs in the region 40 near an end surface of the light emitting layer 23. The non-emission recombination occurs due to damage of the end surface of the light emitting layer 23 in a manufacturing step or due to dangling bond included in the light emitting layer 23 itself or impurities or the like absorbed to the end surface of the light emitting layer 23. Along with the miniaturization of the light emitting diode, such a problem is caused that the rate of the area of a non-emission part due to the non-emission recombination in the region 40 near the end surface of the light emitting layer 23 is relatively increased and the light-emitting efficiency is reduced.

Means for solving the problem is well known in JP 2013-110374A. A light emitting device disclosed in the Japanese unexamined patent application publication includes a recombination suppressing structure provided at least near an end surface of a light emitting layer and having a larger band gap than the light emitting layer.

CITATION LIST

Patent Literature

Patent Literature 1: JP 2013-110374A

DISCLOSURE OF INVENTION

Technical Problem

A technology disclosed in JP 2013-110374A is means that is effective to improve the light-emitting efficiency. However, there is a problem to require a step of forming and oxidizing a crystalized film through the whole surface and a step of patterning the crystalized film after forming a columnar laminated structure in which a first compound semiconductor layer, a light emitting layer formed of a compound semiconductor, and a second compound semiconductor layer are laminated.

Therefore, it is an object of the present disclosure to provide a light emitting diode to enable the improvement of the light-emitting efficiency irrespective of manufacturing with a simple step.

Solution to Problem

According to the present disclosure in order to achieve the above object, there is provided a light emitting diode including: a columnar laminated structure in which a first compound semiconductor layer, a light emitting layer formed of a compound semiconductor, and a first portion of a second compound semiconductor layer are laminated; and a first electrode electrically connected to the first compound semiconductor layer. A second portion of the second compound semiconductor layer is formed on the first portion of the second compound semiconductor layer, apart from an edge portion of the first portion of the second compound semiconductor layer, a second electrode is formed at least on a top surface of the second portion of the second compound semiconductor layer, and light is outputted at least from the top surface and a side surface of the second portion of the second compound semiconductor layer.

Advantageous Effects of Invention

In a light emitting diode of the present disclosure, a so-called mesa structure is configured with a second portion of a second compound semiconductor layer, and a second electrode is formed at least on a top surface of the second portion of the second compound semiconductor layer. Therefore, when current flows between the second electrode and the first electrode, current does not flow (or hardly flows) in a region of the laminated structure positioned near a side wall of the columnar laminated structure, and non-emission recombination does not occur (or occurs less frequently) at an edge portion of the light emitting layer in the columnar laminated structure, and the light-emitting efficiency is enhanced irrespective of enabling manufacturing in a simple step. Further, in the light emitting diode of the present disclosure, light is outputted at least from a top surface and a side surface of the second portion of the second compound semiconductor layer. Therefore, the area for outputting light from the light emitting diode is increased, and thus it is possible to provide a light emitting diode with great improvement of light output. Note that the effects described in the description are only examples, and are not limited, and an additional effect may exist.

MODE(S) FOR CARRYING OUT THE INVENTION

Hereinbelow, the present disclosure will be described on the basis of embodiments with reference to drawings. However, the present disclosure is not limited to the embodiments and various numerical values and materials in the embodiments are examples. Note that the description will be given in the following order.
1. Description of light emitting diode of the present disclosure and general matters
2. First embodiment (light emitting diode of the present disclosure and light emitting diode with first configuration)
3. Second embodiment (modification of the first embodiment and light emitting diode with second configuration)
4. Third embodiment (modifications of the first embodiment and the second embodiment)
5. Others
<Description of Light Emitting Diode of the Present Disclosure and General Matters>

In a light emitting diode of the present disclosure, such a form can be used that light is outputted outside from a second compound semiconductor layer side of the light emitting diode. Further, in the light emitting diode of the present disclosure including such a preferable form, such a form can be used that light is outputted outside from a first compound semiconductor layer side of the light emitting diode. That is, in the light emitting diode of the present disclosure, such a form can be used that light is outputted outside from the second compound semiconductor layer side of the light emitting diode, light is outputted outside from the first compound semiconductor layer side, and light is outputted outside from the second compound semiconductor layer side and the first compound semiconductor layer side.

In the light emitting diode of the present disclosure including the preferable forms, a second electrode can be provided on a top surface of a second portion of the second compound semiconductor layer, apart from an edge portion of the top surface of the second portion of the second compound semiconductor layer. Note that the light emitting diode with the configuration is called a 'light emitting diode with a first configuration' for a convenience. Further, in the light emitting diode with the first configuration, when current flows between the second electrode and the first electrode, light is not emitted at least in a region near a side wall of the laminated structure.

Alternatively, in the light emitting diode of the present disclosure including the preferable forms,
an insulating layer is formed on a top surface of a first portion of the second compound semiconductor layer.
the second electrode is formed of a transparent conductive material, and can be formed extending from the top surface to a side surface of the second portion of the second compound semiconductor layer, and on the insulating layer. Note that the light emitting diode with such a configuration is called a 'light emitting diode with a second configuration' for convenience. Further, in the light emitting diode with the second configuration, a configuration can be adopted in which the first portion of the second compound semiconductor layer is provided with a resistance increase effect structure. The resistance increase effect structure means a structure with an insulating layer (high-resistance layer) formed with methods, which will be described in the following (A) to (D). Note that, also in the light emitting diode with the second configuration, a configuration can be adopted in which when current flows between the second electrode and the first electrode, light is not emitted at least in the region near a side wall of the laminated structure. Further, a configuration can be adopted in which a current introducing wiring is connected to a part of the second electrode on the insulating layer.

As materials forming the insulating layer, a $SiO_X$-based material, a $SiN_Y$-based material, $SiO_XN_Y$-based material, $Ta_2O_5$, $ZrO_2$, AlN, and $Al_2O_3$ can be exemplified. As a method for forming the insulating layer, there can be exemplified a PVD method, such as a vacuum vapor deposition method and a sputtering method, or a CVD method. Further, the insulating layer (or high-resistance layer) can also be formed on a surface of or inside of a first portion of the second compound semiconductor layer. Specifically, the following methods may be used, for example.
(A) The insulating layer (high-resistance layer) is formed at the formation of the second compound semiconductor layer.
(B) The layer (insulating layer or high-resistance layer) with a conductivity type opposite to a conductivity type of the second compound semiconductor layer is formed at the formation of the second compound semiconductor layer.
(C) The insulating layer (high-resistance layer) is formed by achieving insulation (with high resistance) based on crystal destruction due to ion injection or the like to the second compound semiconductor layer.
(D) The insulating layer (high-resistance layer) is formed by ion injection or diffusion (vapor diffusion or solid diffusion) of a material with a conductivity type opposite to the conductivity type of the second compound semiconductor layer.

Further, in the light emitting diode of the present disclosure including the preferable forms and configurations, a configuration can be adopted in which a light extraction enhancement effect structure is provided on the top surface of the first portion of the second compound semiconductor layer. Herein, the light extraction enhancement effect structure means a structure for enhancing the light extraction efficiency from the first portion of the second compound semiconductor layer by providing concave and convex portions to the first portion of the second compound semiconductor layer. The concave and convex portions of the first portion have an effect for reducing a current path of the second compound semiconductor layer and increasing the resistance of the first portion of the second compound semiconductor layer as well as the light extraction efficiency. That is, a configuration can be adopted in which current does not flow or hardly flows through the concave and convex portions of the first portion, and light is not emitted at least in the region near the side wall of the laminated structure.

In the light emitting diode of the present disclosure, when a thickness direction of the laminated structure is the Z direction, a cross-section of the second portion of the second compound semiconductor layer on an XY virtual plane can have any shapes, and for example, a circular, a square, a rectangular, and a polygon can be exemplified. The cross-section of a columnar laminated structure on the XY virtual plane can be square- or rectangular-shaped As the cross-sectional area of the columnar laminated structure on the XY virtual plane, $2.5 \times 10^3$ μm$^2$ or less, specifically, from $1 \times 10^2$ μm$^2$ to $2.5 \times 10^3$ μm$^2$ can be exemplified.

Note that, with a description based on another expression, the light emitting diode of the present disclosure includes:

a columnar laminated structure unit in which a first compound semiconductor layer, a light emitting layer formed of a compound semiconductor, and a second compound semiconductor layer are laminated;

a first electrode electrically connected to the first compound semiconductor layer; and a second electrode, in which the laminated structure unit has a mesa structure, the mesa structure is formed by partly removing the second compound semiconductor layer in the thickness direction or is formed by selectively forming the second compound semiconductor layer in the thickness direction, apart from an edge portion of the columnar laminated structure unit, and light is outputted at least from a top surface and a side surface of the second compound semiconductor layer forming the mesa structure.

In the following description, a part of the laminated structure positioned under the second portion of the second compound semiconductor layer is called a 'second portion of the laminated structure' for convenience, and a part of the laminated structure positioned outside the second portion of the laminated structure is called a 'first portion of the laminated structure' for convenience.

In the light emitting diode of the present disclosure including the above-mentioned various preferable forms and configurations, when current flows between the second electrode and the first electrode, the current density of the current flowing through the second portion of the laminated structure is $J_2$ and the current density of the current flowing through the first portion of the laminated structure is $J_1$, it is preferable to satisfy $$0 \leq J_1/J_2 \leq 0.5.$$

Note that a value of $J_1/J_2$ is controlled by various parameters for controlling electric characteristics, such as:

[A] an electric resistivity, a carrier density, and a carrier mobility of each compound semiconductor layer and the difference in specific resistance between the second compound semiconductor layer and the light emitting layer

Figure 3:
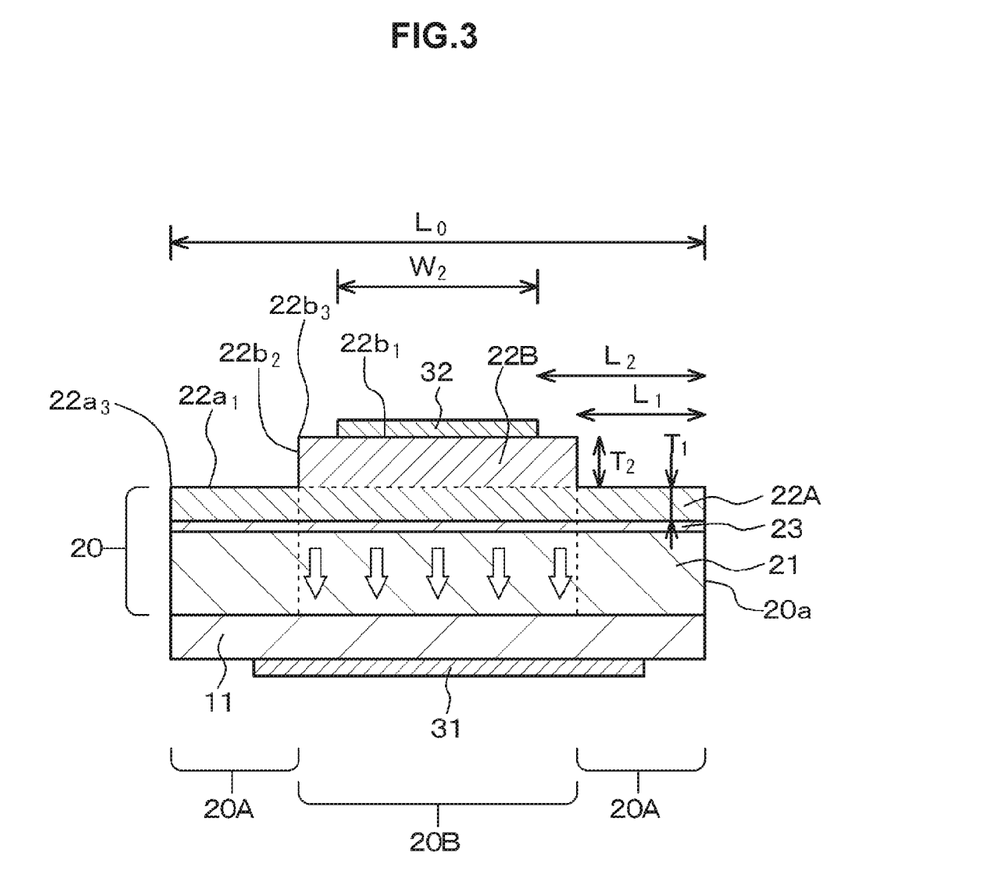
FIG. 3 is a schematic cross-sectional view for explaining various parameters of the light emitting diode of the first embodiment.

[B] a rate of the thickness of the second portion to the thickness of the first portion of the second compound semiconductor layer (regarding the thickness of the first portion and the second portion of the second compound semiconductor layer, refer to $T_1$ and $T_2$ in FIG. 3)

[C] the distance between a projection image of the edge portion of the second portion of the second compound semiconductor layer to the first portion and the edge portion of the first portion (refer to $L_1$ in FIG. 3)

[D] the distance between a projection image of the edge portion of the second electrode to the first portion of the second compound semiconductor layer and the edge portion of the first portion (refer to $L_2$ in FIG. 3)

[E] size of the second electrode (refer to $W_2$ in FIG. 3)

[F] narrowing of a current path, that is, high resistance of the first portion of the second compound semiconductor layer by providing the first portion of the second compound semiconductor layer with the light extraction enhancement effect structure or the resistance increase effect structure. Note that, it is possible to accomplish control of the value of $J_1/J_2$ on the basis of any one of the parameters, and it is also possible to accomplish control of the value of $J_1/J_2$ by combination of a plurality of the parameters (including all combinations).

As a compound semiconductor forming various compound semiconductor layers in the light emitting diode of the present disclosure, there can be exemplified a GaN-based compound semiconductor (including AlGaN mixed crystal, AlInGaN mixed crystal, or InGaN mixed crystal), an InN-based compound semiconductor, an InP-based compound semiconductor, an AlN-based compound semiconductor, a GaAs-based compound semiconductor, an AlGaAs-based compound semiconductor, an AlGaInP-based compound semiconductor, an AlGaInAs-based compound semiconductor, an AlAs-based compound semiconductor, a GaInAs-based compound semiconductor, a GaInAsP-based compound semiconductor, a GaP-based compound semiconductor, and a GaInP-based compound semiconductor. As n-type impurities added to the compound semiconductor layer, there are, e.g., Silicon (Si), Selenium (Se), Germanium (Ge), Tin (Sn), Carbon (C), and Titanium (T). As p-type impurities, there are, e.g., Zinc (Zn), Magnesium (Mg), Beryllium (Be), Cadmium (Cd), Calcium (Ca), Barium (Ba), and Oxygen (O). As a method for forming the layers (film forming method), there are a metal organic chemical vapor deposition method (MOCVD method or MOVPE method), a metal-organic molecular beam epitaxy method (MOMBE method), a hydride vapor phase epitaxy method (HVPE method) in which Halogen contributes to transit or reaction, a plasma assisted physical vapor phase epitaxy method (PPD method), and an LPE method (liquid phase epitaxy method). The light emitting layer may be formed from a single compound semiconductor layer or may have a single quantum well structure (SQW structure) or a multiple quantum well structure (MQW structure).

As a material in the MOCVD method for forming the compound semiconductor layer, there can be cited well-known materials such as Trimethylgallium (TMG), Triethylgallium (TEG), Trimethylaluminium (TMA), Trimethylindium (TMI), and Arsine (AsH$_3$), and can be, for example, Ammonia gas and Hydrazine as nitrogen-source gas. Moreover, for example, as the n-type impurities (n-type dopant), in a case of adding Silicon (Si), Monosilane (SiH$_4$) gas may be used as a Si source. In a case of adding Selenium (Se), H$_2$Se may be used as the Se source. On the other hand, in a case of adding magnesium (Mg) as the p-type impurities (p-type dopant), Cyclopentadienyl Magnesium, methyl Cyclopentadienyl Magnesium, or Bis Cyclopentadienyl Magnesium (Cp$_2$Mg) may be used as a Mg source. In a case of adding Zinc (Zn), Dimethylzinc (DMZ) may be used as a Zn source. Note that, as the n-type impurities (n-type dopant), there can be cited Ge, Sn, C, and Ti other than Si and Se. As the p-type impurities (p-type dopant), there can be cited Cd, Be, Ca, Ba, and O other than Mg and Zn. Furthermore, in a case of manufacturing a red-light emitting diode, as a material to be used, there can be exemplified Trimethylaluminium (TMA), Triethylaluminum (TEA), Trimethylgallium (TMG), Triethylgallium (TEG), Trimethylindium (TMI), Triethylindium (TEI), Phosphine ($PH_3$), Arsine, Dimethylzinc (DMZ), Diethylzinc (DEZ), $H_2S$, Hydrogen Selenide ($H_2Se$), and Biscyclopentane Dimethylzinc.

As a substrate (substrate for manufacturing) for manufacturing a light emitting diode, there can be cited a GaAs substrate, a GaN substrate, a SiC substrate, an Alumina substrate, a Sapphire substrate, a ZnS substrate, a ZnO substrate, an AlN substrate, a LiMgO substrate, a $LiGaO_2$ substrate, a $MgAl_2O_4$ substrate, an InP substrate, a Si substrate, a Ge substrate, a GaP substrate, an AlP substrate, an InN substrate, an AlGaInN substrate, an AlGaN substrate, an AlInN substrate, a GaInN substrate, an AlGaInP substrate, an AlGaP substrate, an AlInP substrate, a GaInP substrate, and these substrates each of which has a bottom layer or a buffer layer formed on the surface (primary surface) thereof. The light emitting diode is first provided on the substrate for manufacturing. As a final form of the light emitting diode, however, there can be cited a form in which the light emitting diode is formed on the substrate for manufacturing, and a form in which the substrate for manufacturing is removed. In the latter case, the light emitting diode may be attached to a supporting substrate (irrespective of conductivity, insulation property, and the semiconductor), fixed or jointed.

The first compound semiconductor layer has a first conductivity type and the second compound semiconductor layer has a second conductivity type opposite to the first conductivity type. In a case where the first conductivity type is an n-type, the second conductivity type is a p-type. In a case where the first conductivity type is the p-type, the second conductivity type is the n-type. In the light emitting diode of the present disclosure, specifically, there can be cited the n-type as the first conductivity type and the p-type as the second conductivity type.

The second portion of the second compound semiconductor layer (formation of the mesa structure) is formed by etching a part of the second compound semiconductor layer in the thickness direction on the basis of combination of a well-known lithography technology and a dry-etching technology or wet-etching technology after forming a laminated structure in which the first compound semiconductor layer, the light emitting layer formed of the compound semiconductor, and the second compound semiconductor layer are laminated. A part of the second compound semiconductor layer remained after the etching is a first portion of the second compound semiconductor layer, and the remaining part of the non-etched second compound semiconductor layer is a second portion of the second compound semiconductor layer. However, the formation (formation of the mesa structure) of the second portion of the second compound semiconductor layer is not limited to this method. In addition, the second portion of the second compound semiconductor layer (formation of the mesa structure) can also be formed, for example, by selectively adding and forming the second portion of the second compound semiconductor layer after forming the laminated structure in which the first compound semiconductor layer, the light emitting layer formed of the compound semiconductor, and the first portion of the second compound semiconductor layer are laminated. In order to selectively form the second portion of the second compound semiconductor layer, a crystal growth suppressing layer, such as a $SiO_2$ layer, may be formed on the first portion of the second compound semiconductor layer by combination of the well-known lithography technology and the dry-etching technology or wet-etching technology, and lift-off technology, and the first portion where the second portion of the second compound semiconductor layer is to be formed may be exposed. Then, the second compound semiconductor layer is selectively grown on the exposed first portion where the second portion of the second compound semiconductor layer is to be formed by a well-known crystal growth method, thereby obtaining the second portion.

When the first conductivity type is the n-type and the second conductivity type is the p-type, as a transparent conductive material forming the second electrode, there can be exemplified Indium Oxide, Indium Tin Oxide (ITO, including $In_2O_3$ of Sn-dope, crystal ITO, and amorphous ITO), Indium Zinc Oxide (IZO), Indium Gallium Oxide (IGO), Indium-dope Gallium Zinc Oxide (IGZO, In—$GaZnO_4$), IFO (F-dope $In_2O_3$), Tin Oxide ($SnO_2$), ATO (Sb-dope $SnO_2$), FTO (F-dope $SnO_2$), Zinc Oxide (ZnO, including Al-dope ZnO, B-dope ZnO, and Ga-dope ZnO), Antimony Oxide, Spinel-type Oxide, and Oxide with a $YbFe_2O_4$ structure. Alternatively, as the second electrode, there can be cited a transparent conductive film having as a mother layer, such as a Gallium Oxide, Titanium Oxide, Niobium Oxide, and Nickel Oxide. As an opaque conductive material forming the second electrode, there can be cited at least one type metal selected from a group consisting of Palladium (Pd), Platinum (Pt), Nickel (Ni), Aluminum (Al), Titanium (Ti), Gold (Au), and Silver (Ag). The second electrode may be a single-layer configuration or a multi-layer configuration (e.g., Ti/Pt/Au). The first electrode preferably has a single-layer configuration or a multi-layer configuration including at least one type metal (including alloy) selected from a group consisting of, e.g., Gold (Au), Silver (Ag), Palladium (Pd), Platinum (Pt), Nickel (Ni), Aluminum (Al), Titanium (Ti), Tungsten (W), Vanadium (V), Chromium (Cr), Copper (Cu), Zinc (Zn), Tin (Sn), and Indium (In). For example, there can be exemplified Ti/Au, Ti/Al, Ti/Pt/Au, Ti/Al/Au, Ni/Au, AuGe/Ni/Au, Ni/Au/Pt, Ni/Pt, Pd/Pt, and Ag/Pd. Note that, a more previous layer of '/' in the multi-layer configuration is positioned more on the light emitting layer side. Also, in the following description, it is similar. The first electrode is electrically connected to the first compound semiconductor layer. The first electrode may be formed on the first compound semiconductor layer. When the substrate for manufacturing has conductive property, the first electrode may be formed on the substrate for manufacturing. To the first electrode or the second electrode (including an extended portion of the electrodes), as necessary, there may be provided, for example, a connecting portion having a multi-layer metal layer with a laminating configuration such as [adhering layer (Ti layer or Cr layer, etc.)]/[barrier metal layer (Pt layer, Ni layer, TiW layer or Mo layer, etc.)]/[metal layer (e.g., Au layer) with high compatibility to attachment] such as Ti layer/Pt layer/Au layer, or a contact portion (pad electrode). Alternatively, the contact portion (pad electrode) preferably has a single-layer configuration or a multi-layer configuration including at least one type metal selected from a group consisting of Titanium (Ti), Aluminum (Al), Platinum (Pt), Gold (Au), Nickel (Ni), and Palladium (Pd) (e.g., Ti/Au multi-layer configuration, Ti/Pd/Au multi-layer configuration, Ti/Pd/Au multi-layer configuration, Ti/Ni/Au multi-layer configuration, or Ti/Ni/Au/Cr/Au). The first electrode, the second electrode, the connecting portion, and the contact portion (pad electrode) can be formed by various PVD methods such as the vacuum vapor deposition method and the sputtering method, various CVD methods, and a plating method.

Further, in the light emitting diode of the present disclosure, a light output may be increased by combination of:

[a] a surface texture structure (a structure to enhance a light extraction efficiency on the light output surface, specifically, by roughening a light output surface, more specifically, by providing concave and convex portions on a surface of an insulating layer formed on the top surface of the first portion of the second compound semiconductor layer)

[b] a light reflecting structure (specifically, for example, a structure to form a reflection electrode layer on the first electrode)

[c] a resonant cavity structure (specifically, a structure to enhance a light-emitting efficiency of the light emitting layer by adjusting a thickness and a light reflecting rate of the compound semiconductor layer to form a resonator structure including the light emitting layer)

[d] a non-reflecting coat structure, or, reliability may be further improved by adopting

[e] an overcoat structure with an insulating film, resin or the like (specifically, a structure to separate the light emitting diode from water, liquid, such as acid or alkaline, or steam which cause the deterioration of the light emitting diode by covering the whole light emitting diode with the above-mentioned insulating layer or an overcoat layer, such as a polyimide layer, a polyamide layer, or an acryl resin layer. The overcoat layer itself can have a non-reflecting coat function.) Note that the non-reflecting coat structure is a structure to suppress the return into a light emitting diode of light generated by the difference between an index $n_1$ of refraction inside the light emitting diode and an index $n_2$ of refraction outside the light emitting diode on a front surface of the light extraction surface. Specifically, a structure based on a light interference effect is added. That is, the insulating layer is a transparent layer with high index of refraction controllability formed of $SiO_2$, SiN, or the like, and the thickness of the insulating layer is controlled, thereby improving the light extraction efficiency on the light output surface. Assuming that the thickness of the insulating layer is d, the index of refraction of the insulating layer is $n_1$, an angle formed by a normal line of the light output surface and traveling light is $\varphi$, a natural number (including 0) is k, and a wavelength of output light is $\lambda_0$, when a thickness d of the insulating layer satisfies $$2 \times n_1 \times d \times \cos(\varphi) = (k+1/2) \times \lambda_0,$$

the interference is generated in the propagating light and light radiation intensity of the light can be increased.

Each of the first electrode and the second electrode may be arranged on/under the light emitting diode, or both of the first electrode and the second electrode may be aggregated and formed on either one of the first compound semiconductor layer side and the second compound semiconductor layer side. At this time, there may be adopted a structure (face-up structure) capable of extracting light from a surface with the aggregated electrodes or a structure (flip-chip structure or face-down structure) capable of extracting light from a surface (that is, a surface on the opposite side of the electrodes) without the aggregated electrodes. In the latter case, light is outputted at least from the top surface and the side surface of the second portion of the second compound semiconductor layer, further via the second electrode. However, a structure may be adopted in which a reflecting structure to reflect the light is provided to reflect the light, thereby outputting the light outside from the first compound semiconductor layer side.

The light emitting diode of the present disclosure can be applied, for example, to a device, equipment, and a component for receiving and transmitting an optical signal. Specifically, the light emitting diode can be used for a photo-coupler, a light source for drum-photosensitive printer, a light source for scanner, a light source for optical fiber, a light source for optical disk, an optical remote controller, an optical measurement device, and the like. The number of light emitting diodes to be mounted on a mounting substrate is one or plural, and the number of light emitting diodes, a kind thereof, and mounting (arrangement), an interval, and the like may be determined depending on a specification, application, a function and the like required to a device having the light emitting diode. As a device obtained by mounting the light emitting diode on the mounting substrate, in addition to the devices, e.g., there can be cited an image display device, a backlight, and an illumination device. As a red light emitting diode, a green light emitting diode, and a blue light emitting diode, it is possible to use a diode using a nitride-based III-V compound semiconductor. As the red light emitting diode, it is also possible to use a diode using AlGaInP-based compound semiconductor. Further, there can be cited an ultraviolet light emitting diode (formed of nitride-based III-V compound semiconductor) and an infrared light emitting diode (formed of AlGaAs- or GaAs-based compound semiconductor) for an invisible region used for a motion sensor and the like. Further, a display device unit in a display device of a tiling form in which a plurality of display device units is arranged can be also included in a device obtained by mounting the light emitting diode on the mounting substrate.

As the mounting substrate, there can be exemplified a semiconductor substrate, a printed substrate including a rigid printed wiring board and a flexible printed wiring board, and a lead frame. Alternatively, as the mounting substrate, there can be cited a substrate on which a wiring is formed on a glass substrate and a thin-film transistor substrate (TFT substrate) (on which the thin-film transistor (TFT) is formed). Further, the light emitting diode may be mounted by, e.g., an adhesive, conductive paste, soldering, or plating.

First Embodiment

A first embodiment relates to a light emitting diode of the present disclosure, and, specifically, relates to a light emitting diode with a first configuration.

Figure 1A:
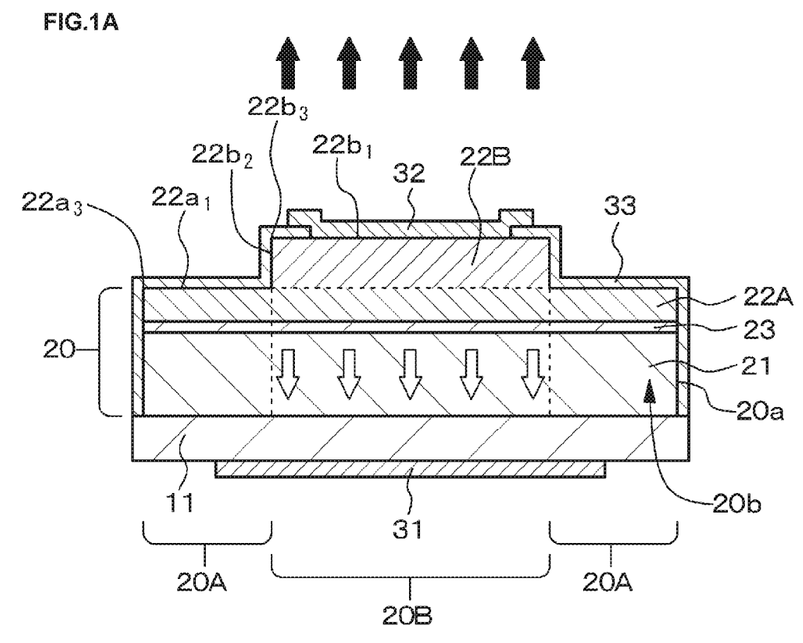
FIGS. 1A and 1B are schematic cross-sectional views of a light emitting diode of a first embodiment and a modification thereof, respectively.

The light emitting diode of the first embodiment, as shown in a schematic cross-sectional view of FIG. 1A, includes:

a columnar laminated structure 20 in which a first compound semiconductor layer 21, a light emitting layer (active layer) 23 formed of a compound semiconductor, and a first portion 22A of a second compound semiconductor layer 22 are laminated; and a first electrode 31 electrically connected to the first compound semiconductor layer 21.

Further, a second portion 22B of the second compound semiconductor layer 22 is formed on the first portion 22A of the second compound semiconductor layer 22, apart from an edge portion $22a_3$ of the first portion 22A of the second compound semiconductor layer 22.

The second electrode 32 is formed at least on a top surface $22b_1$ of the second portion 22B of the second compound semiconductor layer 22.

Light is outputted at least from the top surface $22b_1$ and a side surface $22b_2$ of the second portion 22B of the second compound semiconductor layer 22.

Alternatively, with a description based on another expression, the light emitting diode of the first embodiment includes:

a columnar laminated structure unit in which a first compound semiconductor layer 21, a light emitting layer (active layer) 23 formed of a compound semiconductor, and a second compound semiconductor layer 22 are laminated;

a first electrode 31 electrically connected to the first compound semiconductor layer 21; and a second electrode 32.

The laminated structure unit has a mesa structure.

The mesa structure is formed by removing a part of the second compound semiconductor layer 22 in the thickness direction, or by selectively forming the second compound semiconductor layer 22 in the thickness direction, and is positioned apart from an edge portion of the columnar laminated structure unit.

Light is outputted at least from a top surface and a side surface of the second compound semiconductor layer 22 forming the mesa structure.

The first compound semiconductor layer 21 has a first conductivity type (specifically, n-type), and the second compound semiconductor layer 22 has a second conductivity type (specifically, p-type) as a conductivity type opposite to the first conductivity type.

In the light emitting diode of the first embodiment, light is outputted outside from the second compound semiconductor layer side of the light emitting diode. The second electrode 32 is formed of a transparent conductive material, and light is further outputted via the second electrode 32. Each of the first electrode 31 and the second electrode 32 is arranged on/under the light emitting diode.

In the light emitting diode of the first embodiment, when the thickness direction of the laminated structure 20 is the Z direction, the cross-sectional shape of the second portion 22B of the second compound semiconductor layer 22 on the XY virtual plane is, e.g., circular. Further, the cross-sectional shape of the columnar laminated structure 20 on the XY virtual plane is square with one side $L_0$ (e.g., $L_0$=50 μm). The cross-sectional area of the columnar laminated structure 20 on the XY virtual plane is 50 μm×50 μm=2500 μm².

Further, the second electrode 32 is provided on the top surface $22b_1$ of the second portion 22B of the second compound semiconductor layer 22, apart from the edge portion $22b3$ of the top surface $22b_1$ of the second portion 22B of the second compound semiconductor layer 22. When current flows between the second electrode 32 and the first electrode 31, light is not emitted at least in a region $20b$ positioned near a side wall $20a$ of the laminated structure 20. A current introducing wiring is connected to the second electrode 32, but the current introducing wiring is not shown.

When current flows between the second electrode 32 and the first electrode 31, current mainly flows through the second portion 20B of the laminated structure 20 (part of the laminated structure 20 positioned under the second portion 22B of the second compound semiconductor layer 22). Current does not flow or slight current flows through the first portion 20A (part of the laminated structure 20 positioned outside the second portion 20B of the laminated structure 20) of the laminated structure 20. Assuming that the current density of current flowing through the second portion 20B of the laminated structure 20 is $J_2$ and the current density of the current flowing through the first portion 20A of the laminated structure 20 is $J_1$, it is preferable to satisfy $$0 \leq J_1/J_2 \leq 0.5.$$

In the drawing, the current flowing through the second portion 20B of the laminated structure 20 is shown by a void arrow. Further, a light output direction to be outputted outside is shown by a black arrow.

In the light emitting diode of the first embodiment, the laminated structure 20 formed of an AlGaAs-based compound semiconductor is formed on the substrate 11 formed of a GaAs substrate. Specifically, the laminated structure 20 or the like has a configuration of the following table 1.

TABLE 1

| | |
|---|---|
| Second electrode | ITO |
| Second compound semiconductor layer | p-AlGaAs |
| Light emitting layer | i-AlGaAs |
| First compound semiconductor layer | n-AlGaAs |
| Substrate | n-GaAs |
| First electrode | AuGe/Ni/Au |

Moreover, an insulating layer 33 formed of SiN with thickness of 250 nm is formed on a part of the top surface $22b_1$ of the second portion 22B of the second compound semiconductor layer 22, the side surface $22b_2$ thereof, a top surface $22a_1$ of the first portion 22A of the second compound semiconductor layer 22, and the side wall $20a$ of the laminated structure 20.

In the light emitting diode of the first embodiment, the first compound semiconductor layer 21, the light emitting layer 23, and the second compound semiconductor layer 22 are sequentially deposited on the substrate 11 on the basis of the well-known MOCVD method. Subsequently, a resist layer is formed on the second compound semiconductor layer 22, and the resist layer is used as an etching mask to etch the second compound semiconductor layer 22 partly in the thickness direction on the basis of combination of the well-known lithography technology and the dry-etching technology or wet-etching technology, and thereafter, the resist layer is removed. Thus, the second portion 22B (mesa structure) of the second compound semiconductor layer 22 can be obtained. A part of the second compound semiconductor layer 22 remaining after the etching becomes the first portion 22A of the second compound semiconductor layer 22. The remaining part of the second compound semiconductor layer 22 that is not etched becomes the second portion 22B of the second compound semiconductor layer 22.

Then, the laminated structure is made columnar by etching. Subsequently, the insulating layer 33 is formed on the entire surface. Thereafter, the insulating layer 33 of the part of the top surface on which the second electrode of the second portion 22B of the second compound semiconductor layer 22 is to be formed is removed, and the second electrode 32 is formed by a well-known method. Further, the substrate 11 is made thin as necessary, and the first electrode 31 is formed on the surface side of the substrate 11 on which the laminated structure 20 is not formed. The size of a projection image of the second portion 22B of the second compound semiconductor layer 22 to the first electrode 31 and the size of the first electrode 31 are respectively selected to obtain a current constriction effect. When light is outputted from the second compound semiconductor layer side, additional metal (such as Ag, Al, Au, Pd, or Cu) layer or a Bragg reflection structure (multi-layer film of a compound semiconductor or a transparent material with different indexes of refraction) may be added to the first electrode 31 to reflect light traveling toward the first compound semiconductor.

Incidentally, as mentioned above, when current flows between the second electrode 32 and the first electrode 31, a value of the current density $J_2/J_2$ is controlled by various parameters for controlling electric characteristics, such as [A] to [F] mentioned above. FIG. 3 shows a schematic cross-sectional view for explaining various parameters of the light emitting diode of the first embodiment.

Figure 4A:
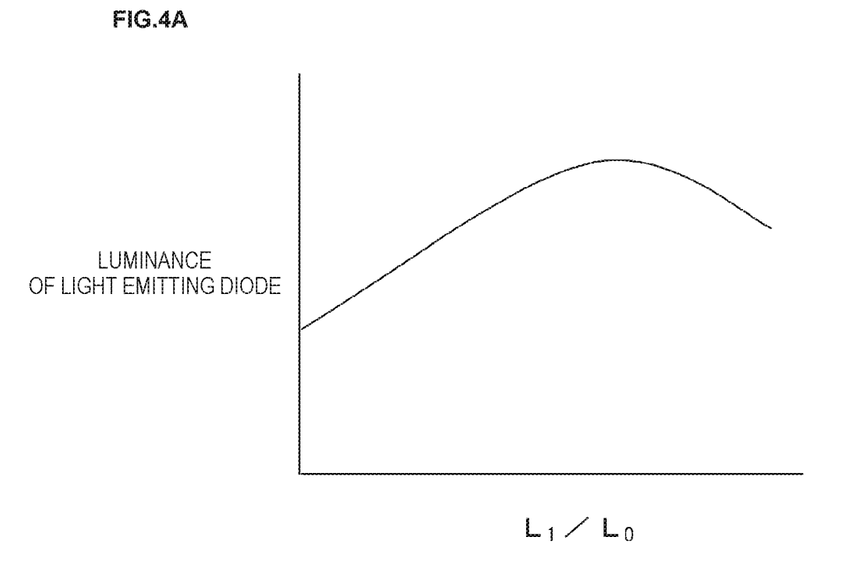
FIG. 4A is a graph schematically showing a relationship between a value obtained by standardizing a distance L1 shown in FIG. 3 and a luminance of the light emitting diode.

FIG. 4A schematically shows a relationship between a value ($L_1/L_0$) obtained by standardizing, by the afore-mentioned $L_0$, the distance $L_1$ between the projection image of an edge portion $22b_3$ of the second portion 22B of the second compound semiconductor layer 22 to the first portion 22A and the edge portion $22a_3$ of the first portion 22A and luminance of the light emitting diode. The luminance is increased when the value of $L_1/L_0$ is increased from a case of $L_1/L_0=0$, that is, from a case where the whole second compound semiconductor layer 22 is formed only of the first portion 22A of the second compound semiconductor layer 22. However, when the value of $L_1/L_0$ is further increased, that is, the size of the second portion 22B of the second compound semiconductor layer 22 is reduced, the luminance is reduced. The value of $L_1/L_0$ is specifically 0.1 to 0.4 when the luminance is at the peak, in the first embodiment.

The amount of current injected to the first portion 20A of the laminated structure is determined with balance between an electric resistance value of the first portion 20A of the laminated structure 20 and an electric resistance value of the second portion 20B of the laminated structure 20. The balance of the electric resistance value is determined by a rate of the thickness of the second portion 22B of the second compound semiconductor layer 22 to the thickness of the first portion 22A thereof, the carrier density and a carrier mobility of the second compound semiconductor layer 22, the difference in specific resistance between the second compound semiconductor layer 22 and the light emitting layer 23, the increase in specific resistance due to the ion injection amount, and the like.

Figure 4B:
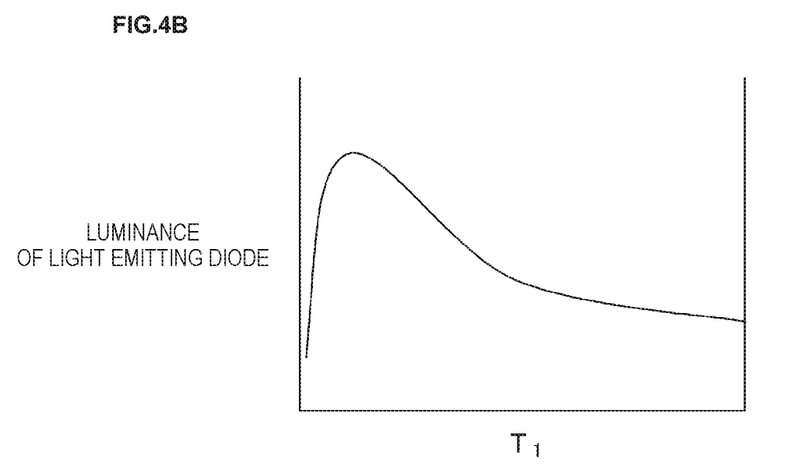
FIG. 4B is a graph schematically showing a relationship between a thickness T1 of a first portion of a second compound semiconductor layer and a luminance of the light emitting diode.

FIG. 4B schematically shows, among them, a relation between a thickness $T_1$ of the first portion 22A of the second compound semiconductor layer 22 and the luminance of the light emitting diode. The right end of a graph in FIG. 4B shows the same structure as that in FIG. 7. That is, it means that the second portion 22B of the second compound semiconductor layer 22 does not exist. When the thickness $T_1$ of the first portion 22A is made thinner, the resistance of the first portion 22A of the second compound semiconductor layer 22A is increased, the current flowing through the first portion 22A is reduced, and the current to a non-emission part is reduced, thereby improving the luminance. The luminance of the light emitting diode is increased as the thickness $T_1$ of the first portion 22A is reduced, and after showing the maximal value, the luminance is sharply reduced as it gets close to $T_1=0$. $T_1=0$ means that the light emitting layer 23 is exposed to the surface, that is, the light emitting layer 23 positioned under the first portion 22A of the second compound semiconductor layer 22 is exposed and the non-emission part is newly formed near the end surface. Thus, the luminance is reduced.

Figure 5:
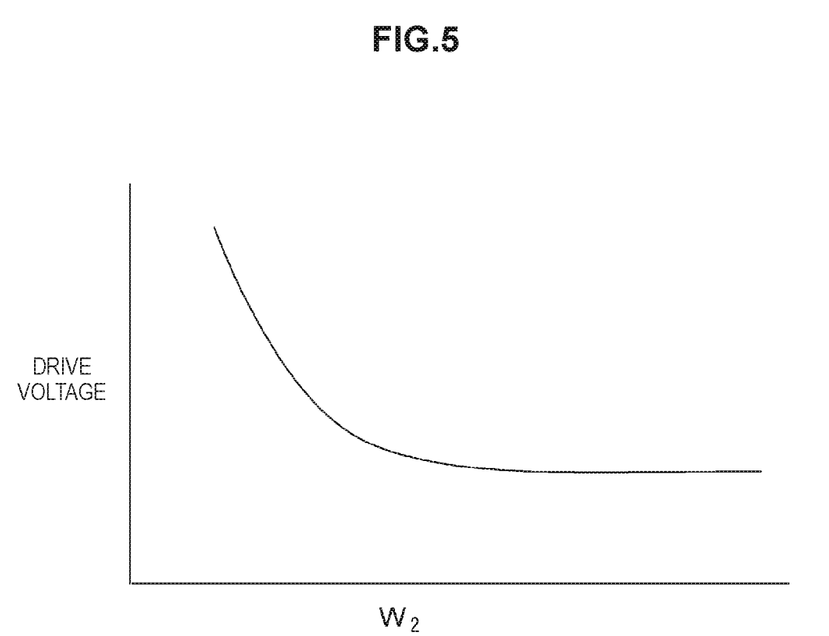
FIG. 5 is a graph schematically showing a relationship between a size $W_2$ of a second electrode and a drive voltage.

FIG. 5 schematically shows a relation between the size $W_2$ of the second electrode 32 and a drive voltage. The change in drive voltage is determined by a contact resistance rate and a contact area between the second electrode 32 and the second compound semiconductor layer 22 and a volume resistance value of the second portion 22B of the second compound semiconductor layer 22. When the second electrode 32 is formed of a transparent conductive material, the second electrode 32 can be formed to cover almost the whole second portion 22B of the second compound semiconductor layer 22. Therefore, the contact resistance value is changed by the area of the second portion 22B of the second compound semiconductor layer 22. In general, the transparent conductive material has a high contact resistance rate.

Therefore, as shown in FIG. 5, when the area of the second portion 22B of the second compound semiconductor layer 22 is reduced, a contact resistance component of the second electrode 32 cannot be ignored and is sharply increased.

In design of the light emitting diode, for example, various parameters of the light emitting diode may be properly determined depending on a specification of the light emitting diode on the basis of results shown in FIGS. 4A, 4B, and 5.

In the light emitting diode of the first embodiment, the second portion 22B of the second compound semiconductor layer 22 forms a mesa structure. The second electrode 32 is formed at least on the top surface $22b_1$ of the second portion 22B of the second compound semiconductor layer 22. Therefore, when current flows between the second electrode 32 and the first electrode 31, current does not flow (or hardly flows) through the region 20b of the laminated structure 20 positioned near the side wall 20a of the columnar laminated structure 20. Non-emission recombination does not occur (or occurs less frequently) at the edge portion of the light emitting layer 23 in the columnar laminated structure 20. In spite of manufacturing with a simple step, the light-emitting efficiency can be improved. Further, light is outputted at least from the top surface $22b_1$ and the side surface $22b_2$ of the second portion 22B of the second compound semiconductor layer 22, further via the second electrode 32. Therefore, the area in which the light is outputted from the light emitting diode is increased, thereby providing the light emitting diode with extreme improvement of the light output. Note that, depending on cases, light is outputted also from the first portion 22A adjacent to the second portion 22B of the second compound semiconductor layer 22A.

Depending on cases, for example, the second electrode 32 may be formed of an opaque conductive material, such as Ti/Pt/Au. In this case, the second electrode 32 is provided on the top surface $22b_1$ of the second portion 22B of the second compound semiconductor layer 22, apart from the edge portion $22b_3$ of the top surface $22b_1$ of the second portion 22B of the second compound semiconductor layer 22. Therefore, light is outputted outside form a part of the top surface $22b_1$ of the second portion 22B of the second compound semiconductor layer 22 that is not covered by the second electrode 32 and the side surface $22b_2$ of the second portion 22B of the second compound semiconductor layer 22.

Figure 1B:
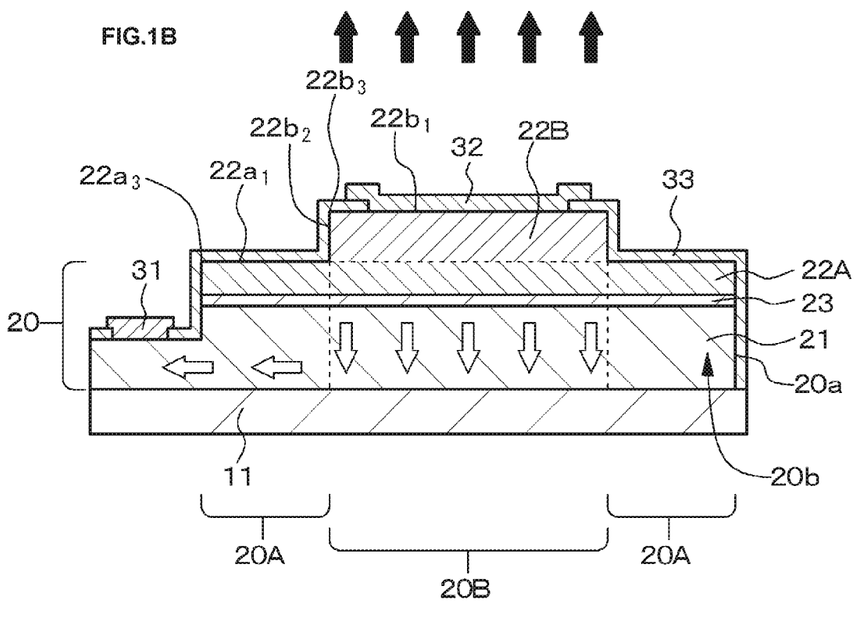

Alternatively, the first electrode 31 may be formed on an exposed part of the first compound semiconductor layer 21 by removing a part of the first portion 20A of the laminated structure 20 and exposing the first compound semiconductor layer 21 (refer to FIG. 1B). That is, both the first electrode 31 and the second electrode 32 may be aggregated and formed on the second compound semiconductor layer side. The light emitting diode of the first embodiment in this case has also a structure (face-up structure) in which light is extracted from a surface (the second compound semiconductor layer side) with the aggregated electrodes.

As mentioned above, in the light emitting diode of the present disclosure, a current constriction structure is realized by applying a structure of a ridge-stripe-type semiconductor laser device of an end-surface emission type to a light emitting diode (LED). Consumption of non-emission carriers on a side wall of a laminated structure of the light emitting diode is suppressed as much as possible, thereby improving a light output. With a past light-emitting diode, as shown in FIG. 7, current is uniformly spread in the light emitting layer, and the whole light-emitting diode emits light. However, with the light emitting diode of the present disclosure, as shown in FIGS. 1A and 1B, the second compound semiconductor layer has a double-layer structure (that is, the thickness of a part of the compound semiconductor layer on the light extraction surface side is thinned to near the light emitting layer), light emission at only the central part of the light emitting diode is successful. Thus, even with the same drive current, in the light emitting diode of the first embodiment, it is successful to obtain a light output of approximately twice or more, as compared with the past light-emitting diode shown in FIG. 7.

In order to obtain the second portion of the second compound semiconductor layer, only the second compound semiconductor layer may be etched in the thickness direction. Therefore, it is possible to use a device or a process for manufacturing a general light-emitting diode, irrespective of a material of the light emitting diode. That is, it is possible to manufacture the light emitting diode with improvement of the light output while keeping preferable productivity.

Note that various configurations as mentioned above can also be properly applied to the following embodiments.

Second Embodiment

Figure 2:
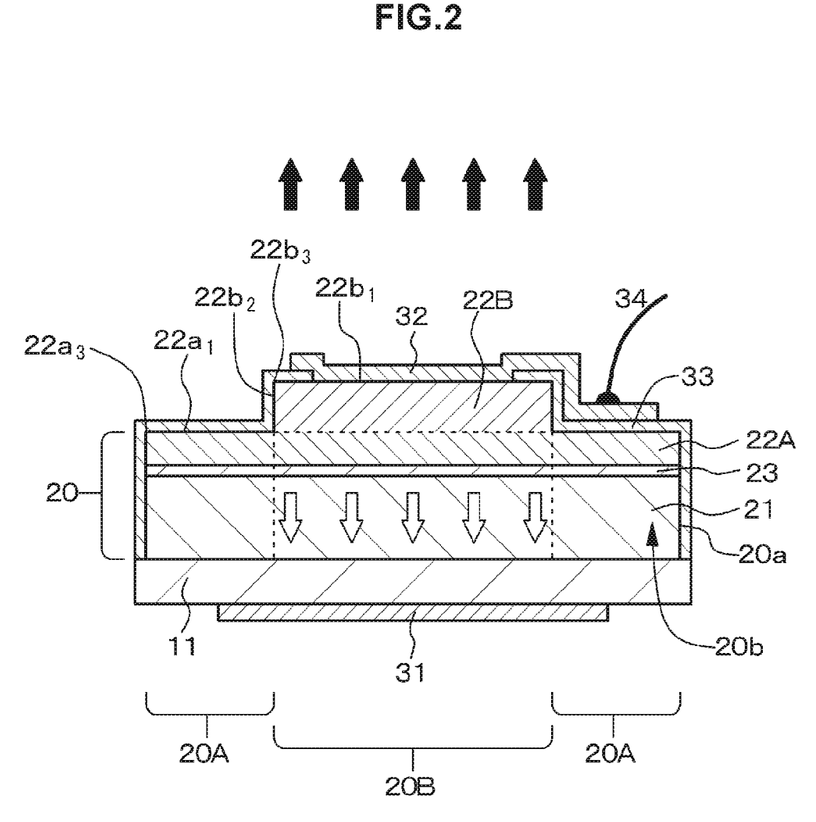
FIG. 2 is a schematic cross-sectional view of a light emitting diode of a second embodiment.

A second embodiment relates to a light emitting diode with a second configuration as a modification of the first embodiment. As a schematic cross-sectional view is shown in FIG. 2, in the light emitting diode of the second embodiment, an insulating layer 33 is formed on the top surface $22a_1$ of the first portion 22A of the second compound semiconductor layer 22, the second electrode 32 is formed of a transparent conductive material, and is formed extending from the top surface $22b_1$ to the side surface $22b_2$ of the second portion 22B of the second compound semiconductor layer 22, and on the insulating layer 33. Further, when current flows between the second electrode 32 and the first electrode 31, light is not emitted at least in the region 20b positioned near the side wall 20a of the laminated structure 20. A current introducing wiring 34 is connected to a part of the second electrode 32 on the insulating layer 33. In the second electrode 32, a contact part (pad electrode) may be provided on a part other than the top surface $22b_1$ of the second portion 22B serving as a main light extraction surface. The above-described structure can also be applied to a modification of the light emitting diode of the first embodiment shown in FIG. 1B.

Third Embodiment

Figure 6:
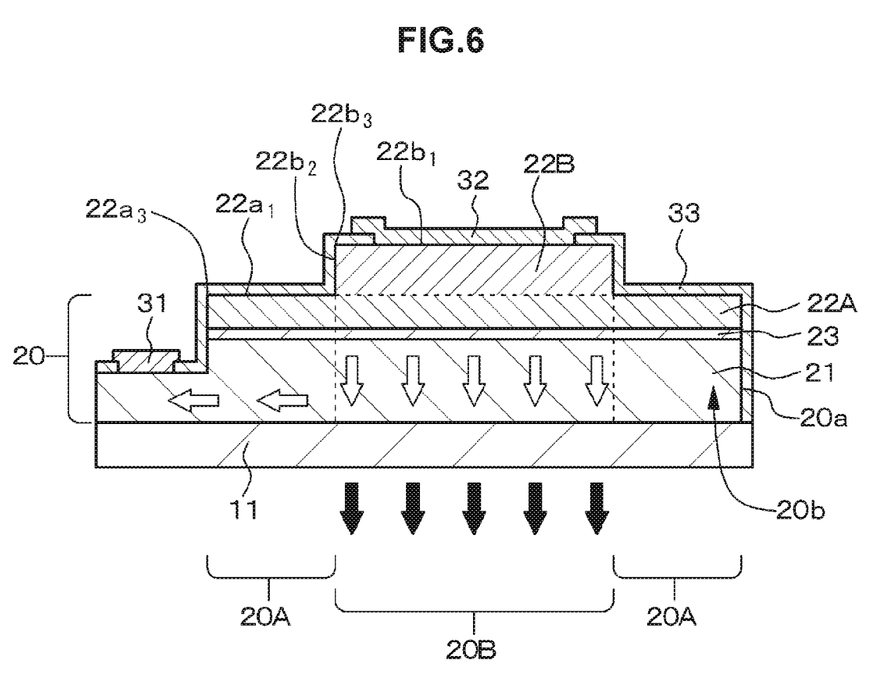
FIG. 6 is a schematic cross-sectional view of a light emitting diode of a third embodiment and a modification thereof.

A third embodiment is a modification of the first embodiment to the second embodiment. However, as a schematic cross-sectional view is shown in FIG. 6, light is outputted outside from the first compound semiconductor layer side of the light emitting diode in the light emitting diode of the third embodiment.

Also in the light emitting diode of the third embodiment, the second compound semiconductor layer 22 is formed of the first portion 22A and the second portion 22B (mesa structure). Further, an insulating layer 33 formed of SiN with thickness of 250 nm is formed on a part of the top surface $22b_1$ of the second portion 22B of the second compound semiconductor layer 22, the side surface $22b_2$, the top surface $22a_1$ of the first portion 22A of the second compound semiconductor layer 22, and the side wall 20a of the laminated structure 20.

Also in the light emitting diode of the third embodiment, the first compound semiconductor layer 21, the light emitting layer 23, and the second compound semiconductor layer 22 are sequentially deposited on the substrate 11 on the basis of the well-known MOCVD method. A material transparent to light outputted from the light emitting layer 23 is used for the substrate 11. Next, a resist layer is formed on the second compound semiconductor layer 22, and a part of the second compound semiconductor layer 22 is etched in the thickness direction on the basis of combination of the well-known lithography technology and the dry-etching technology or wet-etching technology by using the resist layer as an etching mask. Thereafter, the resist layer is removed. Thus, the second portion 22B (mesa structure) of the second compound semiconductor layer 22 can be obtained. A part of the second compound semiconductor layer 22 remaining after the etching becomes the first portion 22A of the second compound semiconductor layer 22, and the remaining part of the second compound semiconductor layer 22 that is not etched becomes the second portion 22B of the second compound semiconductor layer 22.

Thereafter, the laminated structure is etched to have a columnar shape. Subsequently, after formation of the insulating layer 33 on the entire surface, the insulating layer 33 of a part of the top surface where the second electrode of the second portion 22B of the second compound semiconductor layer 22 is to be formed is removed, and the second electrode 32 is formed with the well-known method.

Moreover, a part of the first portion 20A of the laminated structure 20 is removed, thereby exposing the first compound semiconductor layer 21, and the first electrode 31 is formed on the exposed part of the first compound semiconductor layer 21. That is, both the first electrode 31 and the second electrode 32 are aggregated and formed on the second compound semiconductor layer side. Thus, it is possible to obtain the light emitting diode of the third embodiment with the structure shown in FIG. 6.

Note that light is outputted at least from the top surface $22b_1$ and the side surface $22b_2$ of the second portion 22B of the second compound semiconductor layer. However, a structure may be adopted in which the light is reflected by provision of a reflection structure to reflect light and the light is outputted outside via the first compound semiconductor layer 21. That is, a structure (flip-chip structure or face-down structure) is obtained to extract light from the side (the first compound semiconductor layer side) on which the first electrode 31 and the second electrode 32 are not aggregated. The second electrode 32 may be formed of a transparent conductive material or an opaque conductive material. In the former case, light is further outputted via the second electrode 32.

Moreover, in a case where this structure is not provided, not only light is outputted outside via the first compound semiconductor layer 21, but also light is outputted outside from the top surface $22b_1$ of the second portion 22B of the second compound semiconductor layer 22 and the side surface $22b_2$ thereof. Further, in a case where the second electrode 32 is formed of a transparent conductive material, the light is outputted outside via the second electrode 32. Furthermore, depending on cases, light is outputted outside from the first portion 22A adjacent to the second portion 22B of the second compound semiconductor layer 22A. That is, the light generated in the light emitting layer 23 is outputted outside from not only the first compound semiconductor layer side but also the second compound semiconductor layer side.

In the light emitting diode of the third embodiment, too, the second portion 22B of the second compound semiconductor layer 22 forms the mesa structure, and the second electrode 32 is formed at least on the top surface 22b₁ of the second portion 22B of the second compound semiconductor layer 22. Therefore, when current flows between the second electrode 32 and the first electrode 31, current does not flow (or hardly flows) through the region 20b of the laminated structure 20 positioned near the side wall 20a of the columnar laminated structure 20. Non-emission recombination does not occur (or occurs less frequently) at the edge portion of the light emitting layer 23 in the columnar laminated structure 20. In spite of manufacturing with a simple step, the improvement of the light-emitting efficiency can be improved. In addition, light is outputted at least from the top surface 22b₁ and the side surface 22b₂ of the second portion 22B of the second compound semiconductor layer 22, further depending on cases, via the second electrode 32. Therefore, the area in which the light is outputted from the light emitting diode is increased and the light emitting diode with extreme improvement of the light output can be provided. Note that, depending on cases, light is outputted also from the first portion 22A adjacent to the second portion 22B of the second compound semiconductor layer 22A.

Except for the above points, the configuration and structure of the light emitting diode of the third embodiment are similar to the configurations and structures of the light emitting diode described in the first embodiment to the second embodiment. Therefore, a specific description is omitted.

The present disclosure is described above according to the preferable embodiments. However, the present disclosure is not limited to the embodiments. The configurations and structures of the light emitting diode described in the embodiments and the manufacturing method of the light emitting diode are examples, and can be properly changed.

For example, in the light emitting diode described in the second embodiment, a resistance increase effect structure may be provided on the entire surface or a part of the first portion 22A of the second compound semiconductor layer 22 in place of the insulating layer 33. The resistance increase effect structure may have an insulating layer (high-resistance layer) formed by the method described in the above-mentioned (A) to (D).

Alternatively, in the light emitting diode described in the first embodiment to the third embodiment, a light extraction enhancement effect structure may be provided on the entire surface or a part of the top surface 22a₁ of the first portion 22A of the second compound semiconductor layer 22. Specifically, concave and convex portions may be provided throughout a depth from the top surface 22a₁ of the first portion 22A of the second compound semiconductor layer 22. Alternatively, a large number of concave portions (non-through-holes) may be provided on the entire surface or a part of the top surface 22a₁ of the first portion 22A of the second compound semiconductor layer 22 throughout a depth from the top surface 22a₁ of the first portion 22A.

Additionally, the present technology may also be configured as below.

[A01]<<Light Emitting Diode>>

A light emitting diode including:

a columnar laminated structure in which a first compound semiconductor layer, a light emitting layer formed of a compound semiconductor, and a first portion of a second compound semiconductor layer are laminated; and a first electrode electrically connected to the first compound semiconductor layer, in which a second portion of the second compound semiconductor layer is formed on the first portion of the second compound semiconductor layer, apart from an edge portion of the first portion of the second compound semiconductor layer, a second electrode is formed at least on a top surface of the second portion of the second compound semiconductor layer, and light is outputted at least from the top surface and a side surface of the second portion of the second compound semiconductor layer.

[A02]

The light emitting diode according to [A01], in which light is outputted outside from the second compound semiconductor layer side of the light emitting diode.

[A03]

The light emitting diode according to [A01] or [A02], in which light is outputted outside from the first compound semiconductor layer side of the light emitting diode.

[A04]

The light emitting diode according to any one of [A01] to [A03], in which the second electrode is provided on the top surface of the second portion of the second compound semiconductor layer, apart from an edge portion of the top surface of the second portion of the second compound semiconductor layer.

[A05]

The light emitting diode according to any one of [A01] to [A04], in which an insulating layer is formed on a top surface of the first portion of the second compound semiconductor layer, and the second electrode is formed of a transparent conductive material, and is formed extending from the top surface to a side surface of the second portion of the second compound semiconductor layer and on the insulating layer.

[A06]

The light emitting diode according to [A05], in which the first portion of the second compound semiconductor layer is provided with a resistance increase effect structure.

[A07]

The light emitting diode according to [A05] or [A06], in which a current introducing wiring is connected to a part of the second electrode on an insulating layer.

[A08]

The light emitting diode according to any one of [A01] to [A07], in which a light extraction enhancement effect structure is provided on a top surface of the first portion of the second compound semiconductor layer.

[A09]

The light emitting diode according to any one of [A01] to [A08], in which light is not emitted at least in a region near a side wall of the laminated structure when current flows between the second electrode and the first electrode.

[A10]

The light emitting diode according to any one of [A01] to [A09], in which a cross-sectional shape of the second portion of the second compound semiconductor layer on an XY virtual plane is circular, square, or rectangular when a thickness direction of the laminated structure is a Z direction.

REFERENCE SIGNS LIST 11 substrate
20 laminated structure 20a side wall of laminated structure
20b region of laminated structure positioned near side wall of laminated structure
20A first portion of laminated structure
20B second portion of laminated structure
21 first compound semiconductor layer
22 second compound semiconductor layer
22A first portion of second compound semiconductor layer
$22a_1$ top surface of first portion of second compound semiconductor layer
$22a_3$ edge portion of first portion of second compound semiconductor layer
22B second portion of second compound semiconductor layer
$22b_1$ top surface of second portion of second compound semiconductor layer
$22b_2$ side surface of second portion of second compound semiconductor layer
$22b_3$ edge portion of top surface of second portion of second compound semiconductor layer
23 light emitting layer (active layer)
31 first electrode
32 second electrode
33 insulating layer
34 current introducing wiring
40 region near end surface of light emitting layer

The invention claimed is:

1. A light emitting diode, comprising:
a columnar laminated structure that includes a first compound semiconductor layer, a light emitting layer, and a first portion of a second compound semiconductor layer, wherein
the light emitting layer comprises a compound semiconductor, and
the first compound semiconductor layer, the light emitting layer, and the first portion of the second compound semiconductor layer are laminated;
a first electrode electrically connected to the first compound semiconductor layer, wherein
the first electrode comprises a Bragg reflection structure,
the Bragg reflection structure is configured to reflect light which travel toward the first compound semiconductor layer,
a second portion of the second compound semiconductor layer is on an area of the first portion of the second compound semiconductor layer, and
the area of the first portion of the second compound semiconductor layer is different from an edge portion of the first portion of the second compound semiconductor layer;
a second electrode which is at least on a top surface of the second portion of the second compound semiconductor layer, wherein
the light is output at least from the top surface of the second portion of the second compound semiconductor layer and a side surface of the second portion of the second compound semiconductor layer, and
the second electrode includes a pad electrode on the side surface of the second portion of the second compound semiconductor layer; and
an insulating layer in contact with each of a top surface of the first portion of the second compound semiconductor layer, the top surface of the second portion of the second compound semiconductor layer, and a side wall of the columnar laminated structure.

2. The light emitting diode according to claim 1, wherein the light is output to outside of the light emitting diode from a side of the second compound semiconductor layer.

3. The light emitting diode according to claim 1, wherein
the second electrode is on an area of the top surface of the second portion, and
the area of the top surface is different from an edge portion of the top surface of the second portion.

4. The light emitting diode according to claim 1, wherein
the second electrode includes a transparent conductive material,
the second electrode extends from the top surface of the second portion of the second compound semiconductor layer to the side surface of the second portion of the second compound semiconductor layer, and
the second electrode is on the insulating layer.

5. The light emitting diode according to claim 4, wherein the first portion of the second compound semiconductor layer has a resistance increase effect structure.

6. The light emitting diode according to claim 1, further comprising a light extraction enhancement effect structure on the top surface of the first portion of the second compound semiconductor layer.

7. The light emitting diode according to claim 1, wherein
the first electrode is on an exposed part of the first compound semiconductor layer, and
the exposed part corresponds to a portion of a top surface of the first compound semiconductor layer.

8. The light emitting diode according to claim 4, wherein the second electrode extends from the top surface of the second portion of the second compound semiconductor layer to the top surface of the first portion of the second compound semiconductor layer.

9. The light emitting diode according to claim 1, further comprising a substrate between the first electrode and the first compound semiconductor layer.

* * * * *